United States Patent
Pavia

(10) Patent No.: US 10,763,076 B2
(45) Date of Patent: Sep. 1, 2020

(54) METHOD FOR OPERATING A PARTICLE BEAM GENERATOR FOR A PARTICLE BEAM DEVICE AND PARTICLE BEAM DEVICE COMPRISING A PARTICLE BEAM GENERATOR

(71) Applicant: Carl Zeiss Microscopy GmbH, Jena (DE)

(72) Inventor: Giuseppe Pavia, Aalen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 16/405,405

(22) Filed: May 7, 2019

(65) Prior Publication Data
US 2019/0355551 A1    Nov. 21, 2019

(30) Foreign Application Priority Data

May 16, 2018  (DE) .................. 10 2018 207 645

(51) Int. Cl.
*H01J 37/28* (2006.01)
*H01J 27/22* (2006.01)
(Continued)

(52) U.S. Cl.
CPC .............. *H01J 37/28* (2013.01); *G21K 5/10* (2013.01); *H01J 27/22* (2013.01); *H01J 27/26* (2013.01);
(Continued)

(58) Field of Classification Search
CPC .. H01J 27/22; H01J 27/26; H01J 37/28; H01J 37/08; H01J 37/153; H01J 2237/0805; H01J 2237/28; G21K 5/10
See application file for complete search history.

(56) References Cited

U.S. PATENT DOCUMENTS 5,111,053 A    5/1992  Suzuki
5,399,865 A    3/1995  Umemura et al.
(Continued)

FOREIGN PATENT DOCUMENTS

DE    10 2017 202 339 B3    5/2018
EP         2 264 738 A1      12/2010
(Continued)

OTHER PUBLICATIONS

Merijn Bronsgeest, "Physics of Schottky Electron Sources," Theory and Pptimum Operation, Pan Stanford, 2016, ISBN 978-981-4364-79-9.

*Primary Examiner* — Nicole M Ippolito
*Assistant Examiner* — Hanway Chang
(74) *Attorney, Agent, or Firm* — Muirhead and Saturnelli, LLC

(57) ABSTRACT

A method for operating a particle beam generator for a particle beam device, and a particle beam device for carrying out this method, are provided. An extractor voltage may be set to an extractor value using a first variable voltage supply unit. An emission current of the particle beam generator may be measured. When the emission current of the particle beam generator decreases, a suppressor voltage applied to a suppressor electrode may be adjusted using a second variable voltage supply unit such that a specific emission current of the particle beam generator is reached or maintained. When the emission current of the particle beam generator increases, the extractor voltage applied to the extractor electrode may be adjusted using the first variable voltage supply unit such that the specific emission current of the particle beam generator is reached or maintained.

17 Claims, 10 Drawing Sheets

(51) Int. Cl.
*H01J 27/26* (2006.01)
*H01J 37/153* (2006.01)
*G21K 5/10* (2006.01)
*H01J 37/08* (2006.01)

(52) U.S. Cl.
CPC .......... *H01J 37/08* (2013.01); *H01J 37/153* (2013.01); *H01J 2237/0805* (2013.01); *H01J 2237/28* (2013.01)

(56) References Cited

U.S. PATENT DOCUMENTS

| | | |
|---|---|---|
| 7,238,952 B2 | 7/2007 | Ohtsuka |
| 2004/0036031 A1 | 2/2004 | Rose et al. |
| 2007/0257200 A1 | 11/2007 | Kaga et al. |
| 2014/0001373 A1 | 1/2014 | Knappich |

FOREIGN PATENT DOCUMENTS

| | | |
|---|---|---|
| EP | 2 613 338 A2 | 7/2013 |
| WO | WO 2002/067286 A2 | 8/2002 |
| WO | WO 2018/149732 A1 | 8/2018 |

METHOD FOR OPERATING A PARTICLE BEAM GENERATOR FOR A PARTICLE BEAM DEVICE AND PARTICLE BEAM DEVICE COMPRISING A PARTICLE BEAM GENERATOR

CROSS-REFERENCE TO RELATED APPLICATION

This application claims the benefit of German patent application no. 10 2018 207 645.6, filed on May 16, 2018, which application is incorporated herein by reference.

TECHNICAL FIELD

The system described herein relates to a method for operating a particle beam generator for a particle beam device for imaging, analyzing and/or processing an object. Moreover, the system described herein relates to a particle beam device for carrying out this method. In particular, the particle beam device may be an ion beam device and/or an electron beam device.

BACKGROUND OF THE INVENTION

Electron beam devices, in particular a scanning electron microscope (also referred to as SEM below) and/or a transmission electron microscope (also referred to as TEM below), are used to examine objects (also referred to as samples) in order to obtain knowledge in respect of the properties and behavior of the objects under certain conditions.

In an SEM, an electron beam (also referred to as primary electron beam below) is generated by means of a beam generator and is focused on an object to be examined by means of a beam guiding system. An objective lens is used for focusing purposes. The primary electron beam is guided over a surface of the object to be examined by means of a deflection device. This is also referred to as scanning. The area scanned by the primary electron beam is also referred to as scanning region. Here, the electrons of the primary electron beam interact with the object to be examined. Interaction particles and/or interaction radiation result as a consequence of the interaction. By way of example, the interaction particles are electrons. In particular, electrons are emitted by the object—the so-called secondary electrons—and electrons of the primary electron beam are scattered back—the so-called backscattered electrons. The interaction particles form the so-called secondary particle beam and are detected by at least one particle detector. The particle detector generates detection signals which are used to generate an image of the object. An image of the object to be examined is thus obtained. By way of example, the interaction radiation is X-ray radiation or cathodoluminescence light. At least one radiation detector is used to detect the interaction radiation.

In the case of a TEM, a primary electron beam is likewise generated by means of a beam generator and directed onto an object to be examined by means of a beam guiding system. The primary electron beam passes through the object to be examined. When the primary electron beam passes through the object to be examined, the electrons of the primary electron beam interact with the material of the object to be examined. The electrons passing through the object to be examined are imaged onto a luminescent screen or onto a detector—for example in the form of a camera—by a system comprising an objective. By way of example, the aforementioned system additionally also comprises a projection lens. Here, imaging may also take place in the scanning mode of a TEM. Such a TEM is referred to as STEM. Additionally, provision may be made for detecting electrons scattered back at the object to be examined and/or secondary electrons emitted by the object to be examined, by means of at least one further detector in order to image the object to be examined.

Combining the functions of an STEM and an SEM in a single particle beam device is known. It is therefore possible to carry out examinations of objects with an SEM function and/or with an STEM function using this particle beam device.

Moreover, a particle beam device in the form of an ion beam column is known. Ions used for processing an object are generated using an ion beam generator arranged in the ion beam column. By way of example, material of the object is ablated, or material is applied onto the object during the processing. The ions are additionally or alternatively used for imaging.

Furthermore, the prior art has disclosed the practice of analyzing and/or processing an object in a particle beam device using, on the one hand, electrons and, on the other hand, ions. By way of example, an electron beam column having the function of an SEM is arranged at the particle beam device. Additionally, an ion beam column, which has been explained further above, is arranged at the particle beam device. The electron beam column with the SEM function serves, in particular, for examining further the processed or unprocessed object, but also for processing the object.

A particle beam generator in the form of an electron gun is known from the prior art. The known electron gun comprises an electron source having an electron emission surface. Furthermore, the electron gun comprises a first electrode configured to control the path of electrons emitted from the electron emission surface, a second electrode configured to suppress emissions of electrons from a side surface of the electron source and a third electrode configured to accelerate electrons emitted from the electron source to a final energy.

A further particle beam generator in the form of an ion beam generator is also known from the prior art. The ion beam generator comprises an ion source configured to emit ions, a suppressor electrode configured to suppress the emitted ions from a side surface of the ion source, an extractor electrode configured to extract the ions from the ion source, a first variable voltage supply unit for biasing the extractor electrode with an extractor voltage and a second variable voltage supply unit for biasing the suppressor electrode with a suppressor voltage. The particle beam generator provides an emission current comprising the ions.

When using the known ion beam generator, the emission current may follow a specific behavior being dependent on time due to inherent physical characteristics of the ion beam generator. FIG. 1A shows such specific behavior of the emission current EC. In other words, FIG. 1A shows the emission physiology of the known ion beam generator. The emission current EC decreases after an initial time $T_0$. When the emission current EC reaches a minimum at a time $T_{MIN}$, the emission current EC increases for times after $T_{MIN}$ until it reaches a maximum at the time $T_{MAX}$. After the time $T_{MAX}$, the emission current EC decreases again.

When using the ion beam generator, one is intent on obtaining a more or less constant and specific emission current of the ion beam generator. Typical specific emission currents of the ion beam generator are in the range of 1.8 µA to 2.2 μA. For example, the specific emission current of the ion beam generator is 2 μA (see FIG. 1A). It is known to adjust the suppressor voltage applied to the suppressor electrode such that the specific emission current of the ion beam generator is reached or maintained (see FIGS. 1A and 1B). For example, if the emission current EC increases, the suppressor voltage applied to the suppressor electrode is also increased. However, when the emission current EC decreases, the suppressor voltage applied to the suppressor electrode is also decreased. By increasing or decreasing the suppressor voltage applied to the suppressor electrode, the emission current EC of the ion beam generator is adjusted to the specific emission current, for example 2 μA.

If the emission current decreases and falls below a specific threshold, the suppressor voltage applied to the suppressor electrode is also decreased and might reach a lower threshold value of 0 V, and, therefore, does not influence the emission current anymore (see FIG. 1B). If the suppressor voltage applied to the suppressor electrode does not influence the emission current anymore, this might lead to an exhaustion of the ion source which is unwanted. In other words, the specific emission current decreases until it vanishes. If the specific emission current is not reached or maintained, it is known to adjust the extractor voltage applied to the extractor electrode to a new value of the extractor voltage such that the specific emission current is reached or maintained. At this new value of the extractor voltage, the suppressor may influence the emission current and keep the specific emission current stable. However, the new value of the extractor voltage might differ from the previous value of the extractor voltage by a few hundred Volts. This might result in the necessity to realign the particle beam impinging on the object and, therefore, to readjust the particle beam current and particle beam shape on the object. In other words, the path of the ions in the ion beam column is altered due to the change of the extractor voltage and might not be focused on the object anymore. Therefore, the characteristics of all further beam guiding units, in particular the voltages applied to these beam guiding units, have to be changed also such that the beam of ions is realigned and such that the ions travel on a path through the ion beam column suitable for focusing the ions on the object. The effort of a realignment of the ion beam impinging on the object and, therefore, the readjustment of the ion beam current and the ion beam shape on the object may be high and should be avoided, if possible.

If the emission current increases above a specific threshold, the suppressor voltage applied to the suppressor electrode is also increased and might reach an upper threshold value, for example 2 kV and therefore, is not able to uphold the emission anymore. Accordingly, quality of the particle beam decreases. Moreover, the specific emission current may not be reached or maintained anymore using a specific value of the extractor voltage due to physical characteristics of the ion source.

Further methods and devices for adjusting and/or controlling the emission current of an ion beam generator are also known in the prior art. For example, the emission current may be stabilized by filament current variations or by mechanical arrangements.

With respect to the prior art, we refer to EP 2 264 738 A1, U.S. Pat. Nos. 5,111,053 A, 7,238,952 B2, 5,399,865 A and US 2007/0257200 A1.

SUMMARY OF THE INVENTION

Described herein is a system including a method of operating a particle beam generator for a particle beam device for imaging, analyzing and/or processing an object and a particle beam device for carrying out this method which provides a simple means for adjusting and/or controlling an emission current of the particle beam generator.

Embodiments of the method according to the system described herein are used for operating a particle beam generator for a particle beam device for imaging, analyzing and/or processing an object. The aforementioned particle beam device may be an electron beam device and/or an ion beam device. The particle beam generator may comprise at least one particle source configured to emit charged particles. The charged particles may be electrons and/or ions. In particular, the particle source may be a liquid metal ion source (LMIS), for example a gallium liquid metal ion source. Moreover, the particle beam generator may comprise at least one suppressor electrode configured to suppress emissions of the charged particles from a side surface of the particle source, at least one extractor electrode configured to extract the charged particles from the particle source, at least one first variable voltage supply unit for biasing the extractor electrode with an extractor voltage and at least one second variable voltage supply unit for biasing the suppressor electrode with a suppressor voltage. In other words, the particle beam generator according to the system described herein may comprise at least one first variable voltage supply unit applying an extractor voltage to the extractor electrode and at least one second variable voltage supply unit applying a suppressor voltage to the suppressor electrode. For example, the extractor voltage may be in the range of (−5) kV to (−10) kV or in the range of (−6) kV to (−8) kV, wherein the boundaries are included in the range. Moreover, the suppressor voltage may be chosen, for example, in the range of 0 V to 2 kV, wherein the boundaries are included in the range. The invention is not restricted to the aforementioned ranges. Rather, any value of the extractor voltage and the suppressor voltage may be chosen which is suitable for the system described herein.

A method according to an embodiment of the system described herein comprises the step of setting the extractor voltage to an extractor value using the first variable voltage supply unit. In other words, the extractor voltage is set to a desired extractor value using the first variable voltage supply unit. A suitable extractor value may be determined, for example, by a manual search operation or, alternatively, by using an automated optimization procedure. Moreover, such may comprise the step of measuring an emission current of the particle beam generator. The emission current is the current comprising the charged particles provided by the particle beam generator. The emission current may be measured between the particle source and the extractor electrode, for example using the extractor electrode as a measuring device. About 90% of the charged particles emitted by the particle source impinge on the extractor electrode and only a minor portion of the charged particles emitted by the particle source passes a hole in the extractor electrode to be provided further into a particle beam column of the particle beam device. Therefore, by measuring the charged particles impinging on the extractor electrode, the emission current may be sufficiently and precisely determined.

A method according to an embodiment of the system described herein may further comprise the step of adjusting, when the emission current of the particle beam generator decreases, the suppressor voltage applied to the suppressor electrode using the second variable voltage supply unit such that a specific emission current of the particle beam generator is reached or maintained. In other words, when the emission current of the particle beam generator decreases, the suppressor voltage applied to the suppressor electrode is adjusted. It is adjusted in such a way that the specific emission current of the particle beam generator is reached or maintained.

A method according to an embodiment of the system described herein also may comprise the step of adjusting, when the emission current of the particle beam generator increases, the extractor voltage applied to the extractor electrode using the first variable voltage supply unit such that the specific emission current of the particle beam generator is reached or maintained. In other words, when the emission current of the particle beam generator increases, the extractor voltage applied to the extractor electrode is adjusted. It is adjusted in such a way that the specific emission current of the particle beam generator is reached or maintained.

A method according to an embodiment of the system described herein provides for a simple means for adjusting and/or controlling the emission current of the particle beam generator. In particular, such method may ensure that a specific emission current used for a particle beam device is provided. As the extractor voltage is only temporarily changed, the current of the particle beam impinging on the object does not have to be readjusted since the particle beam impinging on the object does not have to be realigned. Therefore, the path of the charged particles within the particle beam column is not changed. The alignment of the particle beam impinging on the object before the extractor voltage has been changed, and, therefore, the current of the particle beam impinging on the object, can be used again after the extractor voltage has been restored.

It is additionally or alternatively provided in an embodiment of the method according to the system described herein that the step of adjusting the suppressor voltage applied to the suppressor electrode comprises decreasing the suppressor voltage applied to the suppressor electrode. In other words, when the emission current of the particle beam generator decreases, the suppressor voltage applied to the suppressor electrode is decreased also using the second variable voltage supply unit such that the specific emission current of the particle beam generator is reached or maintained.

It is additionally or alternatively provided in a further embodiment of the method according to the system described herein that the step of adjusting the extractor voltage applied to the extractor electrode comprises increasing the extractor voltage applied to the extractor electrode. In other words, when the emission current of the particle beam generator increases, the extractor voltage applied to the extractor electrode is increased also using the first variable voltage supply unit such that the specific emission current of the particle beam generator is reached or maintained.

It is additionally or alternatively provided in another embodiment of the method according to the system described herein that the step of setting the extractor voltage to the extractor value comprises the step of setting the extractor voltage from a first value of the extractor voltage to a second value of the extractor voltage, wherein the first value of the extractor voltage is higher than the second value of the extractor voltage. Therefore, in such embodiment, the step of setting the extractor voltage to the extractor value comprises decreasing the extractor voltage from the first value to the second value.

It is additionally or alternatively provided in a further embodiment of the method according to the system described herein that the step of adjusting the extractor voltage applied to the extractor electrode comprises the step of increasing the extractor voltage applied to the extractor electrode from the second value of the extractor voltage to the first value of the extractor voltage until the first value of the extractor voltage is reached. Accordingly, after setting the extractor voltage from the first value to the second value, the extractor voltage is adjusted in such a way that the first value of the extractor voltage is reached again. In other words, when the emission current of the particle beam generator increases, the extractor voltage applied to the extractor electrode is increased also from the second value of the extractor voltage to the first value of the extractor voltage until the first value of the extractor voltage is reached again. After the first value of the extractor voltage has been reached, adjusting of the extractor voltage is stopped.

It is additionally or alternatively provided in an embodiment of the method according to the system described herein that, when the first value of the extractor voltage is reached by increasing the extractor voltage from the second value to the first value, the suppressor voltage applied to the suppressor electrode is increased using the second variable voltage supply unit such that the specific emission current of the particle beam generator is reached or maintained.

It is additionally or alternatively provided in an embodiment of the method according to the system described herein that the step of adjusting the suppressor voltage applied to the suppressor electrode comprises increasing the suppressor voltage applied to the suppressor electrode. In other words, when the emission current of the particle beam generator decreases, the suppressor voltage applied to the suppressor electrode is increased using the second variable voltage supply unit such that the specific emission current of the particle beam generator is reached or maintained.

It is additionally or alternatively provided in a further embodiment of the method according to the system described herein that the step of adjusting the extractor voltage applied to the extractor electrode comprises decreasing the extractor voltage applied to the extractor electrode. In other words, when the emission current of the particle beam generator increases, the extractor voltage applied to the extractor electrode is decreased using the first variable voltage supply unit such that the specific emission current of the particle beam generator is reached or maintained.

It is additionally or alternatively provided in another embodiment of the method according to the system described herein that the step of setting the extractor voltage to the extractor value comprises the step of setting the extractor voltage from a first value of the extractor voltage to a second value of the extractor voltage, wherein the first value of the extractor voltage is lower than the second value of the extractor voltage. Therefore, in such embodiment, the step of setting the extractor voltage to the extractor value comprises increasing the extractor voltage from the first value to the second value.

It is additionally or alternatively provided in a further embodiment of the method according to the system described herein that the step of adjusting the extractor voltage applied to the extractor electrode comprises the step of decreasing the extractor voltage applied to the extractor electrode from a second value of the extractor voltage to a first value of the extractor voltage until the first value of the extractor voltage is reached. Accordingly, after setting the extractor voltage from the first value to the second value, the extractor voltage is adjusted in such a way that the first value of the extractor voltage is reached again. In other words, when the emission current of the particle beam generator increases, the extractor voltage applied to the extractor electrode is decreased from the second value of the extractor voltage to the first value of the extractor voltage until the first value of the extractor voltage is reached again. After the first value of the extractor voltage has been reached, adjusting of the extractor voltage is stopped.

It is additionally or alternatively provided in an embodiment of the method according to the system described herein that, when the first value of the extractor voltage is reached by decreasing the extractor voltage from the second value to the first value, the suppressor voltage applied to the suppressor electrode is decreased using the second variable voltage supply unit such that the specific emission current of the particle beam generator is reached or maintained.

It is additionally or alternatively provided in a further embodiment of the method according to the system described herein that the method comprises using an ion beam generator as the particle beam generator. As already mentioned above, a liquid metal ion source (LMIS) may be used, in particular a gallium liquid metal ion source. Additionally or alternatively, the method comprises using an electron beam generator as the particle beam generator.

In some embodiments of the system described herein, a computer program product is provided comprising a program code which may be loaded or is loaded into a processor and which, when being executed, controls a particle beam device in such a way that a method comprising at least one of the above mentioned or further below mentioned steps or a combination of at least two of the above mentioned or further below mentioned steps is carried out.

In some embodiments of the system described herein, a particle beam device for imaging, analyzing and/or processing an object is provided. The particle beam device comprises at least one particle beam generator for generating a particle beam comprising charged particles. The charged particles may be, for example, electrons, ions, positrons or any other charged particle. The particle beam generator comprises a particle source. In particular, the particle source may be a liquid metal ion source (LMIS), for example a gallium liquid metal ion source. Moreover, the particle beam generator may comprise at least one suppressor electrode configured to suppress emissions of the charged particles from a side surface of the particle source, at least one extractor electrode configured to extract the charged particles from the particle source, at least one first variable voltage supply unit for biasing the extractor electrode with an extractor voltage and at least one second variable voltage supply unit for biasing the suppressor electrode with a suppressor voltage. In other words, the particle beam generator comprises at least one first variable voltage supply unit applying an extractor voltage to the extractor electrode and at least one second variable voltage supply unit applying a suppressor voltage to the suppressor electrode. For example, the extractor voltage may be in the range of (−5) kV to (−10) kV or (−6) kV to (−8) kV, wherein the boundaries are included in the range. Moreover, the suppressor voltage may be chosen, for example, in the range of 0 V to 2 kV, wherein the boundaries are included in the range. The invention is not restricted to the aforementioned ranges. Rather, any value of the extractor voltage and the suppressor voltage may be chosen which is suitable for the system described herein. The particle beam device according to the system described herein also comprises at least one processor into which a computer program product as the one mentioned above is loaded.

In an embodiment of the particle beam device according to the system described herein, it is additionally or alternatively provided that the particle beam device according to the system described herein also has at least one objective lens for focusing the particle beam onto the object. Moreover, the particle beam device according to the system described herein has at least one detector for detecting interaction particles and/or interaction radiation, the interaction particles and the interaction radiation being generated when the particle beam impinges on the object. The interaction particles may be secondary particles and/or backscattered particles, in particular secondary electrons and backscattered electrons. The interaction radiation may be X-rays and/or cathodoluminescence light.

In an embodiment of the particle beam device according to the system described herein, it is additionally or alternatively provided that the particle beam generator is a first particle beam generator for generating a first particle beam comprising first charged particles. The objective lens is a first objective lens for focusing the first particle beam onto the object. The particle beam device according to the embodiment of the system described herein further comprises a second particle beam generator for generating a second particle beam comprising second charged particles and a second objective lens for focusing the second particle beam onto the object. The second charged particles may be electrons and/or ions.

In a further embodiment of the particle beam device according to the system described herein, it is additionally or alternatively provided that the particle beam device is at least one of the following: an electron beam device and an ion beam device. In particular, the particle beam device may be both, an electron beam device and an ion beam device. The electron beam device and the ion beam device may be arranged at angle to each other, for example an angle in the range of 45° to 90°, wherein the boundaries are included in this range. In particular, the electron beam device and the ion beam device may be arranged at an angle of 54° to each other.

However, the invention is not restricted to the above mentioned angles. Rather, any angle between the electron beam device and the ion beam device which is suitable for the system described herein may be used.

BRIEF DESCRIPTION OF THE DRAWINGS

Embodiments of the system described herein will be explained in more detail in the following text with reference to the figures, in which.

DESCRIPTION OF VARIOUS EMBODIMENTS

Various embodiments of the system described herein will now be described in more detail in relation to FIGS. 2-9. It should be appreciated that FIGS. 2-9 provide nonlimiting illustrative examples of the system described herein. Other embodiments of the system, including variations of the embodiments described in relation to FIGS. 2-9, are possible and intended to fall within the scope of the invention.

Figure 1A:
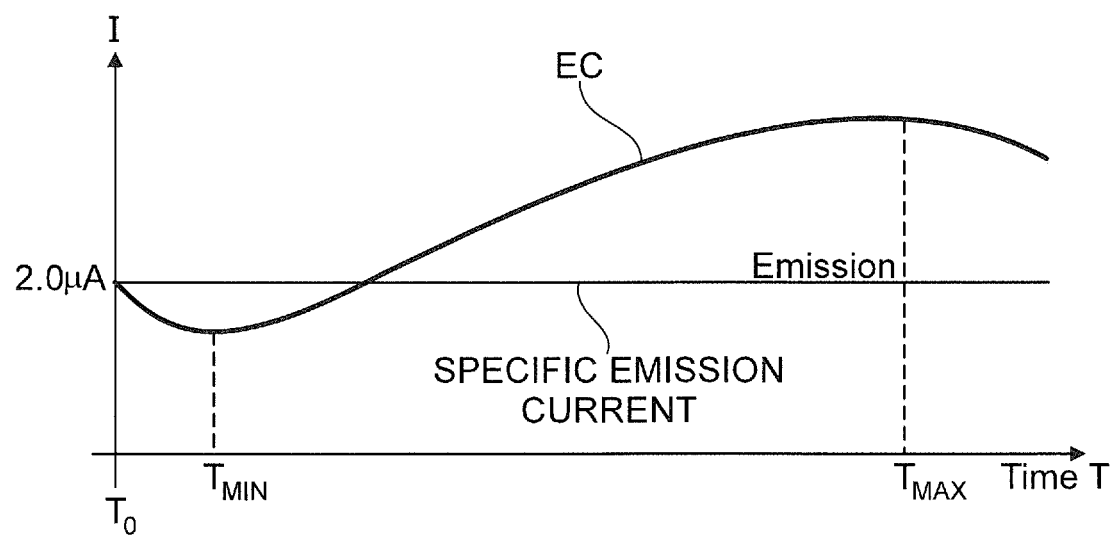
FIG. 1A shows a schematic representation of an emission current of a particle beam generator dependent on time.
Figure 1B:
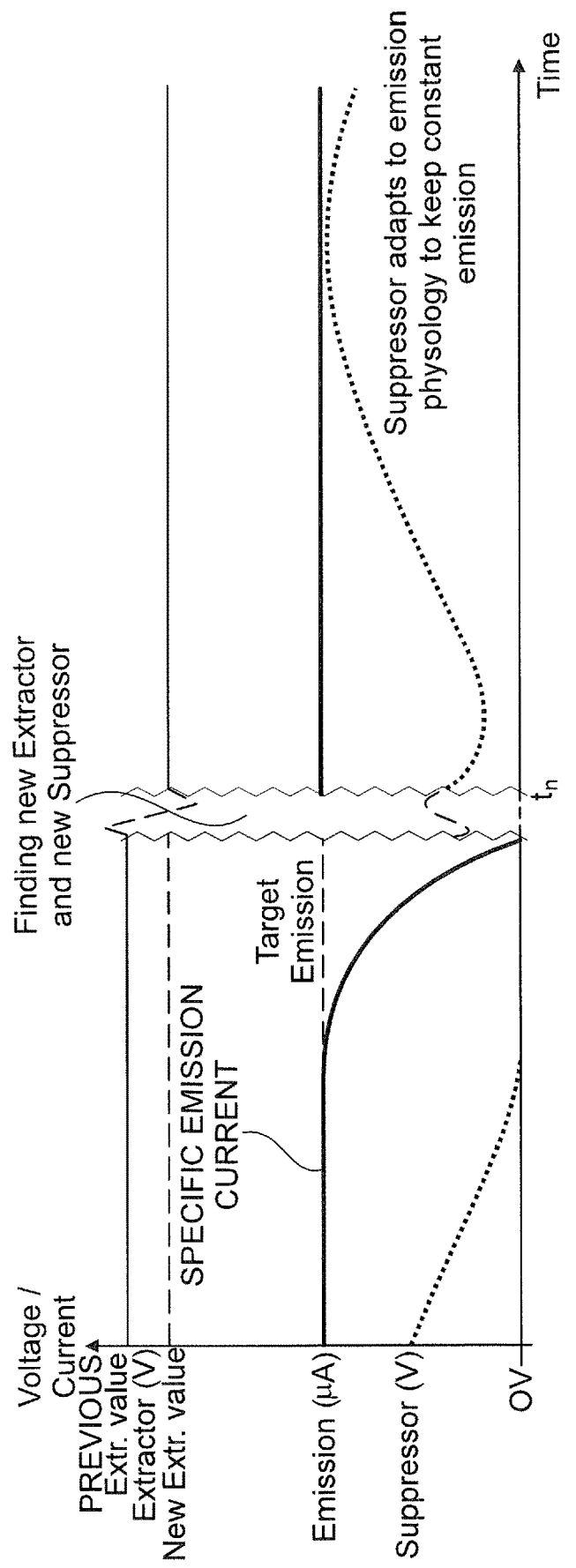
FIG. 1B shows a schematic representation of a specific emission current of a particle beam generator dependent on time and being dependent on a suppressor (prior art)
Figure 2:
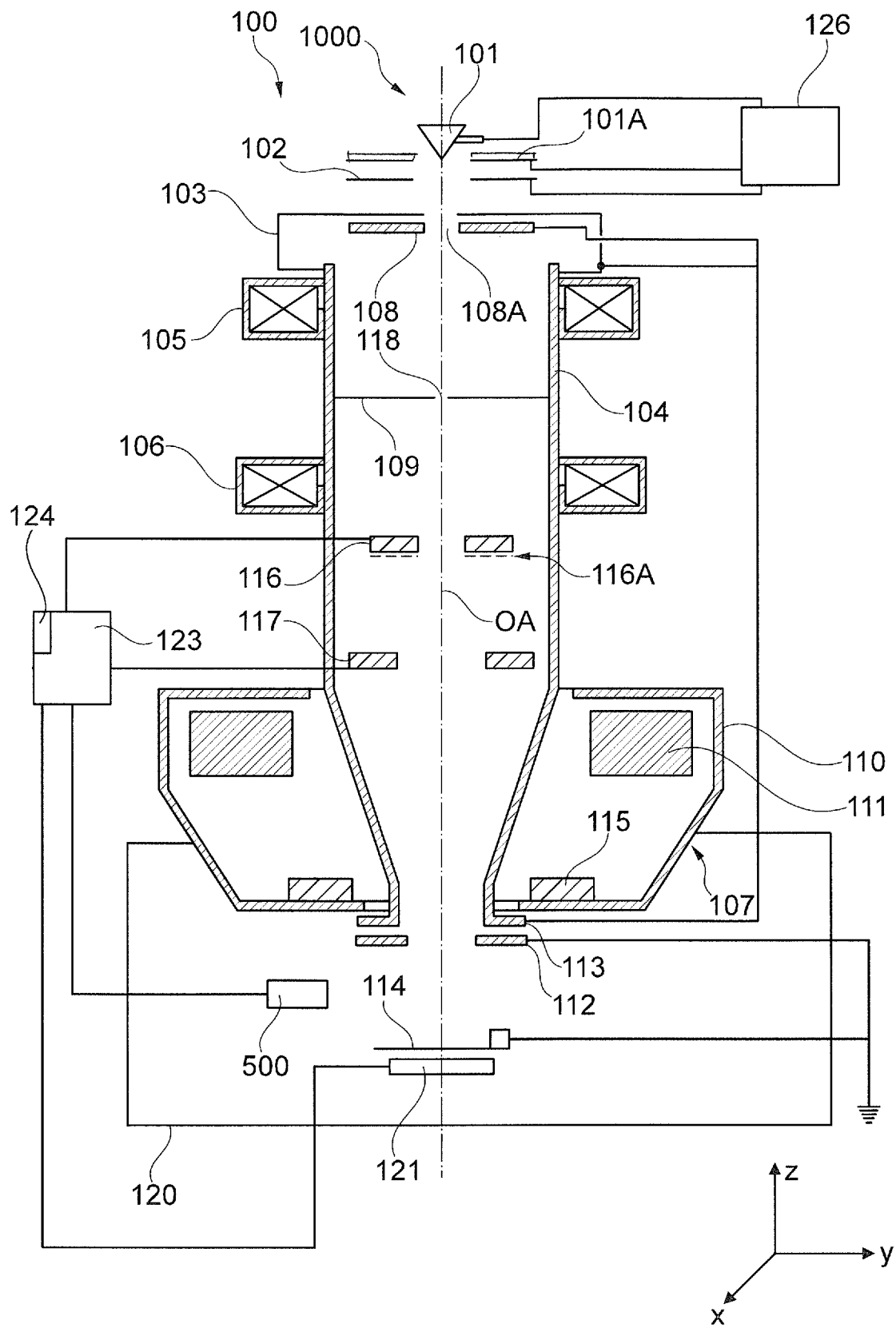
FIG. 2 shows a schematic representation of a first embodiment of a particle beam device according to the system described herein.

FIG. 2 shows a schematic representation of an SEM 100, according to an embodiment of the system described herein. Other embodiments of an SEM, including variations of the SEM 100 are possible and intended to fall within the scope of the invention. The SEM 100 has a particle beam generator 1000 comprising an electron source 101 being a cathode, a suppressor electrode 101A and an extractor electrode 102. Furthermore, the SEM 100 comprises an anode 103 which is arranged on the end of a beam guide tube 104 of the SEM 100. The electron source 101 is, for example, a thermal field emitter. However, the invention is not limited to such an electron source. Instead, any electron source may be used.

The particle beam generator 1000 comprises a beam generator control unit 126. The electron source 101, the suppressor electrode 101A and the extractor electrode 102 are connected to the beam generator control unit 126 and are supplied with voltage by the beam generator control unit 126. This will be explained in detail further below.

Electrons emerging from the electron source 101 form a primary electron beam. The electrons are accelerated to an anode potential due to a potential difference between the electron source 101 and the anode 103. The anode potential in this exemplary embodiment is between 0.2 kV and 30 kV relative to the ground potential of an object chamber 120, for example, 5 kV to 15 kV, in particular 8 kV, but alternatively, it could also be at ground potential.

Two condenser lenses are arranged at the beam guide tube 104, i.e., a first condenser lens 105 and a second condenser lens 106, the first condenser lens 105 being situated first, and then the second condenser lens 106, as viewed from the electron source 101 toward an objective lens 107. However, the invention is not limited to the use of two condenser lenses. Instead, further embodiments may comprise only a single condenser lens.

A first aperture unit 108 is arranged between the anode 103 and the first condenser lens 105. The first aperture unit 108 is, together with the anode 103 and the beam guide tube 104, at high-voltage potential, i.e. the potential of the anode 103, or at ground potential. The first aperture unit 108 may have several first aperture openings 108A. One of those first aperture openings 108A is shown in FIG. 2. For example, the first aperture unit 108 has two first aperture openings 108A. Each of the several first aperture openings 108A may have a different opening diameter. A chosen first aperture opening 108A may be arranged at an optical axis OA of the SEM 100 using an adaption mechanism. However, the invention is not limited to this embodiment. Instead, in an alternative embodiment, the first aperture unit 108 may have a single first aperture opening 108A only. No adaption mechanism is used for this alternative embodiment. The first aperture unit 108 of this alternative embodiment is fixedly arranged around the optical axis OA.

A stationary second aperture unit 109 is arranged between the first condenser lens 105 and the second condenser lens 106. Alternatively, the second aperture unit 109 is moveable.

The objective lens 107 has pole pieces 110, in which a bore has been made. The beam guide tube 104 is arranged and guided through this bore. Further, a coil 111 is arranged in the pole pieces 110.

An electrostatic deceleration device is situated downstream from the beam guide tube 104. It has a single electrode 112 and a tube electrode 113 arranged at the end of the beam guide tube 104 facing an object 114. Consequently, the tube electrode 113 is, together with the beam guide tube 104, at the potential of the anode 103, while the single electrode 112 and the object 114 are at a lower potential than that of the anode 103. In this case, this is the ground potential of the object chamber 120. Thus, the electrons of the primary electron beam may be decelerated to the desired energy required for analyzing the object 114.

In addition, the SEM 100 has a scanning device 115, via which the primary electron beam may be deflected and scanned across the object 114. In this process, the electrons of the primary electron beam interact with the object 114. As a consequence of this interaction, interaction particles and/or interaction radiation will result, which are detected. The detection signals obtained in this manner are evaluated.

As interaction particles, in particular electrons are emitted from the surface of the object 114 (so-called secondary electrons) or electrons of the primary electron beam are scattered back (so-called backscattered electrons). For detecting secondary electrons and/or backscattered electrons, a detector system which has a first detector 116 and a second detector 117 is arranged in the beam guide tube 104. The first detector 116 is arranged on the source-side along the optical axis OA, while the second detector 117 is arranged on the object-side along the optical axis OA in the beam guide tube 104. In addition, the first detector 116 and the second detector 117 are arranged offset against each other toward the optical axis OA of the SEM 100. Both the first detector 116 and the second detector 117 each have a through opening through which the primary electron beam may pass, and they are approximately at the potential of the anode 103 and the beam guide tube 104. The optical axis OA of the SEM 100 passes through the corresponding through openings.

The second detector 117 is used to detect mostly secondary electrons. Secondary electrons emitting from the object 114 have a low kinetic energy and arbitrary direction of movements. However, the secondary electrons are accelerated due to a strong extraction field generated by the tube electrode 113 in the direction of the objective lens 107. The secondary electrons enter the objective lens 107 nearly parallel to the optical axis OA. A diameter of the beam bunch of the secondary electrons is small in the objective lens 107. The objective lens 107, however, affects the beam of secondary electrons and generates a short focus of the secondary electrons having relatively steep angles with respect to the optical axis OA such that the secondary electrons diverge from each other after the focus and may impinge on the second detector 117. Electrons backscattered from the object 114, i.e. backscattered electrons, have a relatively high kinetic energy as compared to secondary electrons when exiting from the object 114. Backscattered electrons are detected only to a very small degree by the second detector 117. The high kinetic energy and the angle of the beam of backscattered electrons with respect to the optical axis OA when backscattered from the object 114 result in a beam waist, i.e. a beam area having a minimal diameter, of the backscattered electrons, the beam waist being arranged in the vicinity of the second detector 117. Therefore, a large part of the backscattered electrons passes through the opening of the second detector 117. Accordingly, backscattered electrons are detected mainly by the first detector 116.

The first detector 116 of a further embodiment of the SEM 100 may have an opposing field grid 116A which is a field grid with an opposing potential. The opposing field grid 116A may be arranged at the side of the first detector 116 facing the object 114. The opposing field grid 116A may comprise a negative potential with respect to the potential of the beam guide tube 104 such that mainly or only backscattered electrons having a high energy may pass the opposing field grid 116A and impinge on the first detector 116. Additionally or alternatively, the second detector 117 may have a further opposing field grid being designed similarly to the above mentioned opposing field grid 116A of the first detector 116 and having an analog function.

The detection signals generated by the first detector 116 and the second detector 117 are used to generate an image or images of the surface of the object 114.

It is pointed out expressly that the aperture openings of the first aperture unit 108 and the second aperture unit 109 as well as the through openings of the first detector 116 and the second detector 117 are represented in an exaggerated manner. The through openings of the first detector 116 and the second detector 117 have a maximum length of between 1 mm and 5 mm perpendicular to the optical axis OA. For example, they have a circular design and a diameter in the range of 1 mm to 3 mm perpendicular to the optical axis OA.

In the exemplary embodiment shown here, the second aperture unit 109 is a circular aperture having a second aperture opening 118 for the primary electron beam to pass through, the second aperture opening 118 having an extension in the range of 25 µm to 50 µm, for example, 35 µm. The second aperture unit 109 may be a pressure stage aperture. The second aperture unit 109 of a further exemplary embodiment may have several openings which may be mechanically moved with respect to the primary electron beam or which may be passed through by the primary electron beam using electrical and/or magnetic deflection devices. As mentioned above, the second aperture unit 109 may also be a pressure stage unit. It separates a first area, in which the electron source 101 is arranged, having an ultra-high vacuum ($10^{-7}$ to $10^{-12}$ hPa), from a second area with a high vacuum ($10^{-3}$ to $10^{-7}$ hPa). The second area is the intermediate pressure area of the beam guide tube 104 leading to the object chamber 120.

In addition to the detector system mentioned above, the SEM 100 has a radiation detector 500 which is arranged in the object chamber 120. The radiation detector 500 is, for example, positioned between the beam guide tube 104 and the object 114. Moreover, the radiation detector 500 is positioned at the side of the object 114. The radiation detector 500 may be a CCD-detector.

The object chamber 120 is operated in a first pressure range or in a second pressure range, wherein the first pressure range only comprises pressures lower than or equal to $10^{-3}$ hPa and wherein the second pressure range only comprises pressures over $10^{-3}$ hPa. A pressure sensor (not shown in FIG. 2) is arranged in the object chamber 120 for measuring the pressure in the object chamber 120. A vacuum system (not shown in FIG. 2) in the form of a pump system being connected to the pressure sensor and being arranged at the object chamber 120 provides for the pressure range, either the first pressure range or the second pressure range, in the object chamber 120.

The SEM 100 may further have a third detector 121 which is arranged in the object chamber 120. The third detector 121 is arranged downstream of the object 114 as seen from the electron source 101 in the direction of the object 114 along the optical axis OA. The primary electron beam may be transmitted through the object 114. Electrons of the primary electron beam interact with the material of the object 114. Electrons transmitted through the object 114 will be detected using the third detector 121.

The first detector 116, the second detector 117, the third detector 121 and the radiation detector 500 are connected to a control unit 123. The control unit 123 comprises a processor 124 into which a computer program product comprising a program code is loaded, which, when being executed, controls the SEM 100 in such a way that a method according to the system described herein is carried out. This will be explained further below.

Figure 3:
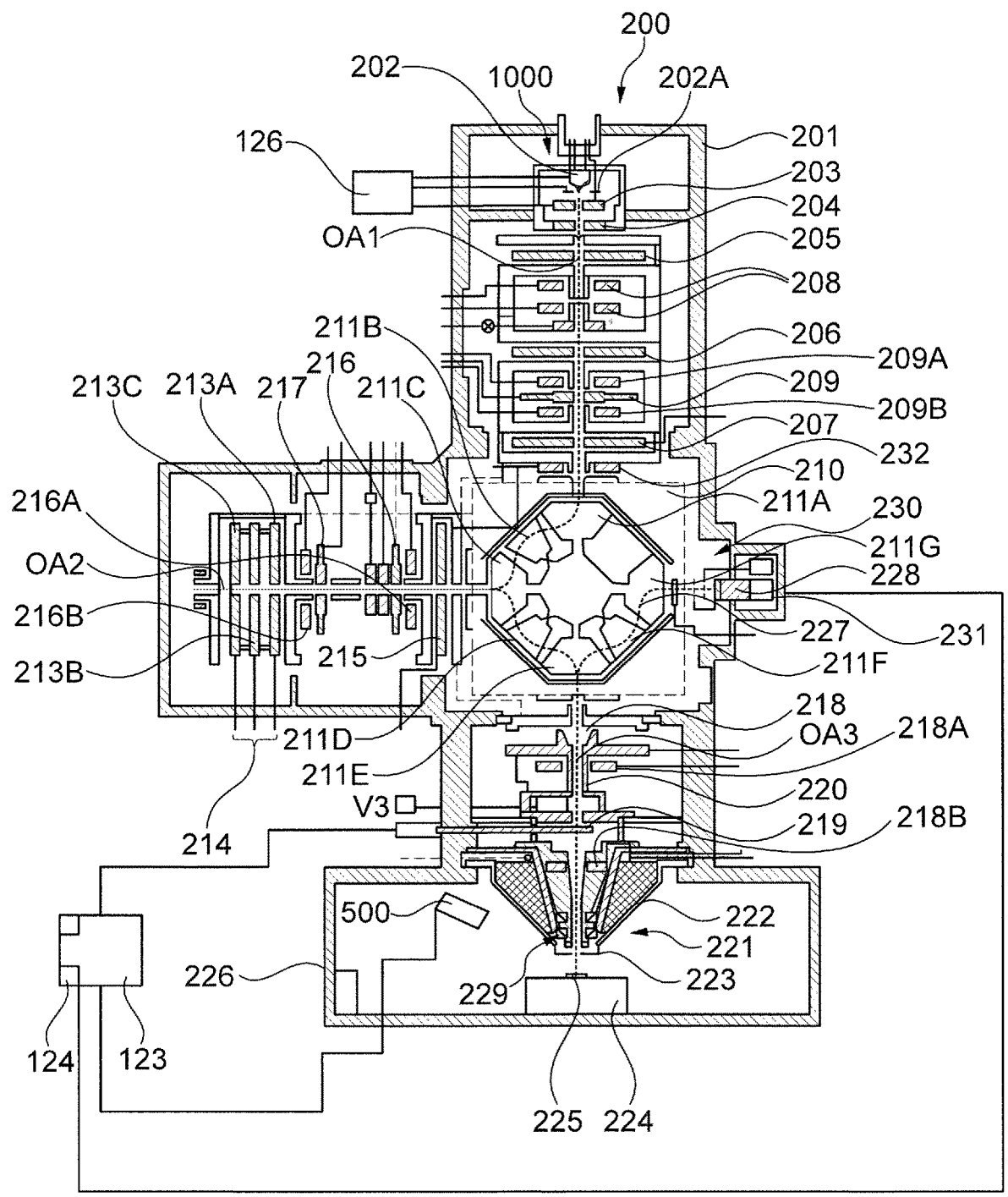
FIG. 3 shows a schematic representation of a second embodiment of a particle beam device according to the system described herein.
Figure 4:
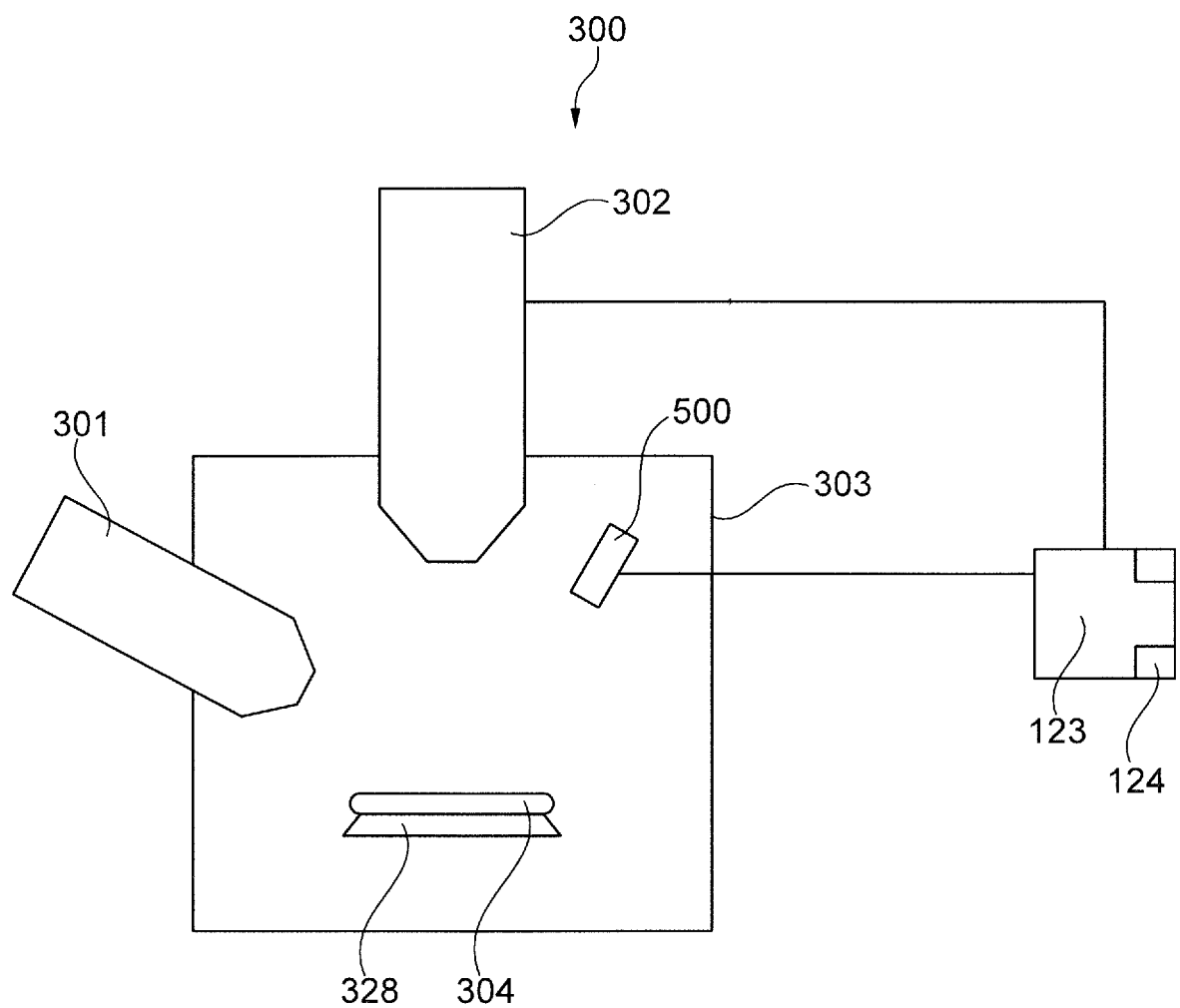
FIG. 4 shows a schematic representation of a third embodiment of a particle beam device according to the system described herein.
Figure 5:
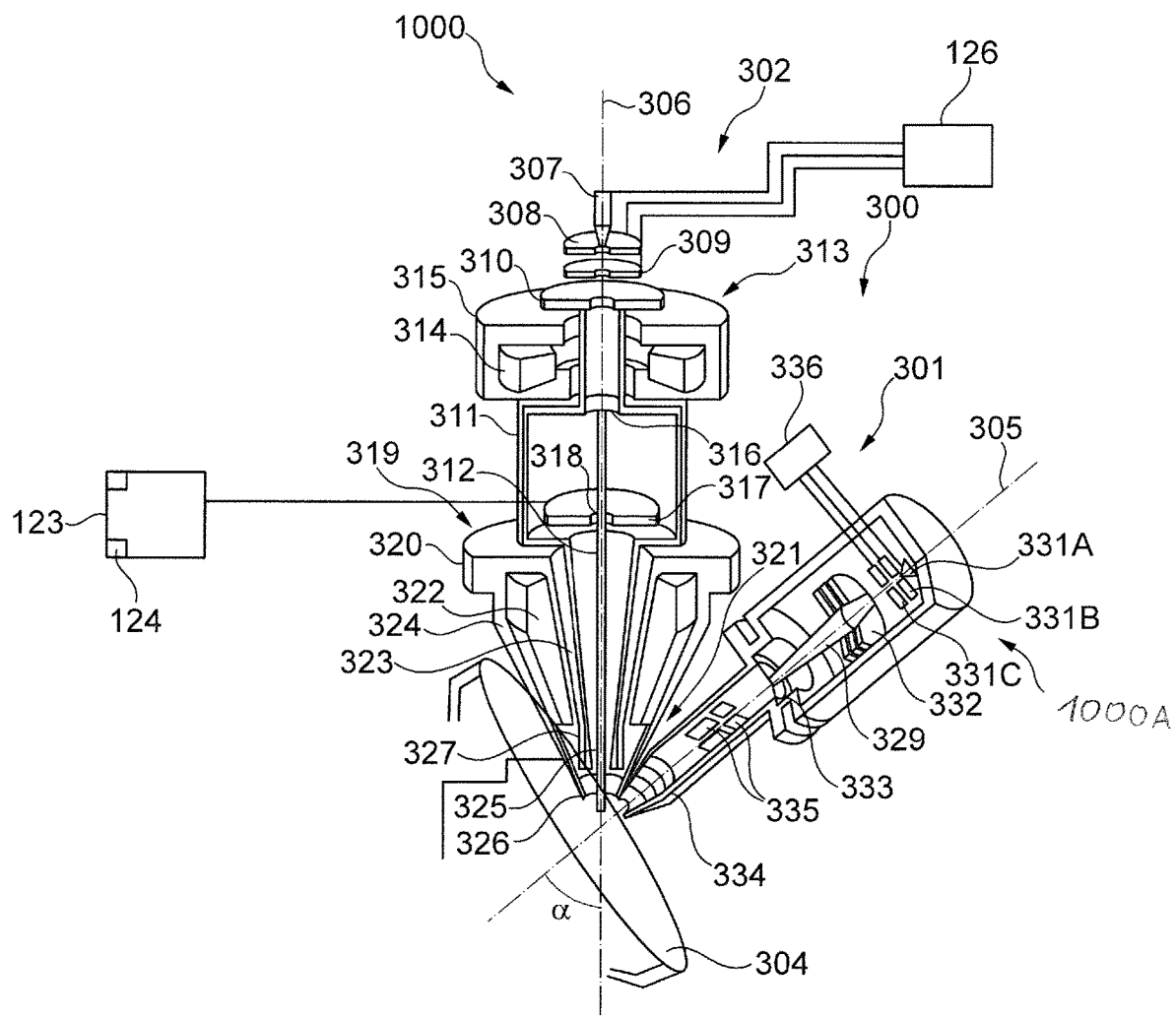
FIG. 5 shows a further schematic representation of the third embodiment of a particle beam device shown in FIG. 4 according to the system described herein.

FIG. 3 is a schematic illustration of a further embodiment of a particle beam device according to an embodiment of the system described herein. Other embodiments of a particle beam device, including variations of the particle beam devices of FIG. 3-5, are possible and intended to fall within the scope of the invention. This embodiment of the particle beam device is denoted with reference sign 200 and comprises a mirror corrector for correcting, for example, chromatic and spherical aberrations. This will be explained in detail further below. The particle beam device 200 comprises a particle beam column 201 being embodied as an electron beam column and, in principle, corresponds to an electron beam column of a corrected SEM. However, the particle beam device 200 according to the invention is not restricted to an SEM with a mirror corrector. Rather, any particle beam device comprising correction units may be used.

The particle beam column 201 comprises a particle beam generator 1000 having an electron source 202 being a cathode, a suppressor electrode 202A and an extractor electrode 203. Moreover, the particle beam column 201 comprises an anode 204. By way of example, the electron source 202 may be a thermal field emitter. Electrons which emerge from the electron source 202 are accelerated by the anode 204 as a result of a potential difference between the electron source 202 and the anode 204. Accordingly, a primary particle beam in the form of an electron beam is provided along a first optical axis OA1.

The particle beam generator 1000 comprises a beam generator control unit 126. The electron source 202, the suppressor electrode 202A and the extractor electrode 203 are connected to the beam generator control unit 126 and are supplied with voltage by the beam generator control unit 126. This will be explained in detail further below.

The primary particle beam is guided along a beam path which—after the primary particle beam has emerged from the electron source 202—is approximately the first optical axis OA1, using a first electrostatic lens 205, a second electrostatic lens 206 and a third electrostatic lens 207.

The primary particle beam is adjusted along the beam path using at least one beam alignment device. The beam alignment device of this embodiment comprises a gun alignment unit comprising two magnetic deflection units 208 arranged along the first optical axis OA1. Furthermore, the particle beam device 200 comprises electrostatic beam deflection units. A first electrostatic beam deflection unit 209 is arranged between the second electrostatic lens 206 and the third electrostatic lens 207. The first electrostatic beam deflection unit 209 is also arranged downstream of the magnetic deflection units 208. A first multipole unit 209A in the form of a first magnetic deflection unit is arranged at one side of the first electrostatic beam deflection unit 209. Furthermore, a second multipole unit 209B in the form of a second magnetic deflection unit is arranged at the other side of the first electrostatic beam deflection unit 209. The first electrostatic beam deflection unit 209, the first multipole unit 209A and the second multipole unit 209B are used for adjusting the primary particle beam with respect to an axis of the third electrostatic lens 207 and an entrance window of a beam deflection device 210. The first electrostatic beam deflection unit 209, the first multipole unit 209A and the second multipole unit 209B may act together as a Wien filter. A further magnetic deflection device 232 is arranged at the entrance of the beam deflection device 210.

The beam deflection device 210 is used as a particle-optical beam splitter which deflects the primary particle beam in a specific way. The beam deflection device 210 comprises several magnetic sectors, namely a first magnetic sector 211A, a second magnetic sector 211B, a third magnetic sector 211C, a fourth magnetic sector 211D, a fifth magnetic sector 211E, a sixth magnetic sector 211F and a seventh magnetic sector 211G. The primary particle beam enters the beam deflection device 210 along the first optical axis OA1 and is deflected by the beam deflection device 210 in the direction of a second optical axis OA2. The beam deflection is effected by the first magnetic sector 211A, the second magnetic sector 211B and the third magnetic sector 211C at an angle of 30° to 120°. The second optical axis OA2 is arranged at an identical angle to the first optical axis OA1. The beam deflection device 210 also deflects the primary particle beam which is guided along the second optical axis OA2 in the direction of a third optical axis OA3. The beam deflection is effected by the third magnetic sector 211C, the fourth magnetic sector 211D and the fifth magnetic sector 211E. In the embodiment shown in FIG. 3, deflecting to the second optical axis OA2 and to the third optical axis OA3 will be done by deflecting the primary particle beam at an angle of 90°. Thus, the third optical axis OA3 runs coaxially to the first optical axis OA1. However, the particle beam device 200 according to the invention is not restricted to deflection angles of 90°. Rather, any suitable deflection angle may be used with the beam deflection device 210, for example 70° or 110°, such that the first optical axis OA1 does not run coaxially to the third optical axis OA3. For further details of the beam deflection device 210, reference is made to WO 2002/067286 A2 which is incorporated herein by reference.

After being deflected by the first magnetic sector 211A, the second magnetic sector 211B and the third magnetic sector 211C, the primary particle beam is guided along the second optical axis OA2. The primary particle beam is guided to an electrostatic mirror 214 and passes—on its way to the electrostatic mirror 214—a fourth electrostatic lens 215, a third multipole unit 216A in the form of a magnetic deflection unit, a second electrostatic beam deflection unit 216, a third electrostatic beam deflection unit 217 and a fourth multipole unit 216B in the form of a magnetic deflection unit. The electrostatic mirror 214 comprises a first mirror electrode 213A, a second mirror electrode 213B and a third mirror electrode 213C. Electrons of the primary particle beam which are reflected back by the electrostatic mirror 214 run again along the second optical axis OA2 and enter again the beam deflection device 210. They are deflected by the third magnetic sector 211C, the fourth magnetic sector 211D and the fifth magnetic sector 211E towards the third optical axis OA3. The electrons of the primary particle beam exit the beam deflection device 210, being guided along the third optical axis OA3 to the object 225 to be examined. On its way to the object 225, the primary particle beam passes a fifth electrostatic lens 218, a beam guiding tube 220, a fifth multipole unit 218A, a sixth multipole unit 218B and an objective lens 221. The fifth electrostatic lens 218 is an electrostatic immersion lens. The primary particle beam is decelerated or accelerated by the fifth electrostatic lens 218 to the electrical potential of the beam guiding tube 220.

The primary particle beam is focused by the objective lens 221 in a focal plane in which the object 225 is positioned. The object 225 is arranged on a movable sample stage 224. The movable sample stage 224 is arranged in an object chamber 226 of the particle beam device 200.

The objective lens 221 may be implemented as a combination of a magnetic lens 222 and a sixth electrostatic lens 223. The end of the beam guiding tube 220 may be one electrode of an electrostatic lens. Particles of the primary particle beam, after exiting from the beam guiding tube 220, are decelerated to the potential of the object 225 arranged on the sample stage 224. The objective lens 221 is not restricted to a combination of the magnetic lens 222 and the sixth electrostatic lens 223. Instead, the objective lens 221 may be implemented in any suitable form. In particular, the objective lens 221 may also be just a mere magnetic lens or just a mere electrostatic lens.

The primary particle beam focused on the object 225 interacts with the object 225. Interaction particles and interaction radiation are generated. In particular, secondary electrons are emitted by the object 225 and backscattered electrons are returned from the object 225. The secondary electrons and the backscattered electrons are again accelerated and are guided into the beam guiding tube 220 along the third optical axis OA3. In particular, the secondary electrons and backscattered electrons travel on the beam path of the primary particle beam in the opposite direction of the primary particle beam.

The particle beam device 200 comprises a first detector 219 which is arranged along the beam path between the beam deflection device 210 and the objective lens 221. Secondary electrons which are guided in directions oriented at large angles with respect to the third optical axis OA3 are detected by the first detector 219. However, backscattered electrons and secondary electrons which are guided in directions having a small axial distance with respect to the third optical axis OA3 at the first detector 219, i.e. backscattered electrons and secondary electrons having a small distance from the third optical axis OA3 at the position of the first detector 219, enter the beam deflection device 210 and are deflected by the fifth magnetic sector 211E, the sixth magnetic sector 211F and the seventh magnetic sector 211G along a detection beam path 227 to a second detector 228 of an analysis unit 231. The total deflection angle may be, for example, 90° or 110°.

The first detector 219 generates detection signals mostly based on the emitted secondary electrons. The second detector 228 of the analysis unit 231 generates detection signals mostly based on backscattered electrons. The detection signals generated by the first detector 219 and the second detector 228 are transmitted to a control unit 123 and are used to obtain information about the properties of the interaction area of the focused primary particle beam with the object 225. If the focused primary particle beam is scanned over the object 225 using a scanning device 229, and if the control unit 123 acquires and stores the detection signals generated by the first detector 219 and the second detector 228, an image of the scanned area of the object 225 can be acquired and displayed by the control unit 123 or a monitor (not shown).

A filter electrode 230 may be arranged in front of the second detector 228 of the analysis unit 231. The filter electrode 230 may be used to separate the secondary electrons from the backscattered electrons due to the kinetic energy difference between the secondary electrons and the backscattered electrons.

In addition to the first detector 219 and the second detector 228, the particle beam device 200 also has a radiation detector 500 which is arranged in the object chamber 226. The radiation detector 500 is positioned at the side of the object 225 and is directed to the object 225. The radiation detector 500 may be a CCD-detector and detects interaction radiation arising from the interaction of the primary particle beam with the object 225, in particular X-rays and/or cathodoluminescence light.

The object chamber 226 is operated in a first pressure range or in a second pressure range, wherein the first pressure range only comprises pressures lower than or equal to $10^{-3}$ hPa and wherein the second pressure range only comprises pressures over $10^{-3}$ hPa. A pressure sensor (not shown in FIG. 3) is arranged in the object chamber 226 for measuring the pressure in the object chamber 226. A vacuum system (not shown in FIG. 3) in the form of a pump system being connected to the pressure sensor and being arranged at the object chamber 226 provides for the pressure range in the object chamber 226, either the first pressure range or the second pressure range.

The first detector 219, the second detector 228 of the analysis unit 231 and the radiation detector 500 are connected to the control unit 123. The control unit 123 comprises a processor 124 into which a computer program product comprising a program code is loaded, which, when being executed, controls the particle beam device 200 in such a way that a method according to the system described herein is carried out. This will be explained further below.

FIG. 4 shows a schematic illustration of another embodiment of a particle beam device 300 according to an embodiment of the system described herein. The particle beam device 300 has a first particle beam column 301 in the form of an ion beam column, and a second particle beam column 302 in the form of an electron beam column. The first particle beam column 301 and the second particle beam column 302 are arranged on an object chamber 303, in which an object 304 to be imaged, analyzed and/or processed is arranged. It is explicitly noted that the system described herein is not restricted to the first particle beam column 301 being in the form of an ion beam column and the second particle beam column 302 being in the form of an electron beam column. In fact, the system described herein also provides for the first particle beam column 301 to be in the form of an electron beam column and for the second particle beam column 302 to be in the form of an ion beam column. A further embodiment of the system described herein provides for both the first particle beam column 301 and the second particle beam column 302 each to be in the form of an ion beam column.

FIG. 5 shows a detailed illustration of the particle beam device 300 shown in FIG. 4 according to an embodiment of the system described herein. For clarity reasons, the object chamber 303 is not illustrated. The first particle beam column 301 in the form of the ion beam column has a first optical axis 305. Furthermore, the second particle beam column 302 in the form of the electron beam column has a second optical axis 306.

The second particle beam column 302, in the form of the electron beam column, will be described next. The second particle beam column 302 comprises a particle beam generator 1000 having a second beam generator 307, a first electrode 308, and a second electrode 309. By way of example, the second beam generator 307 is a thermal field emitter emitting electrons. The first electrode 308 has the function of a suppressor electrode, while the second electrode 309 has the function of an extractor electrode. Moreover, the second particle beam column 302 comprises a third electrode 310. The third electrode 310 is an anode, and at the same time forms one end of a beam guide tube 311.

The particle beam generator 1000 comprises a beam generator control unit 126. The second beam generator 307, the first electrode 308 and the second electrode 309 are connected to the beam generator control unit 126 and are supplied with voltage by the beam generator control unit 126. This will be explained in detail further below.

A second particle beam 312 in the form of an electron beam is generated by the second beam generator 307. Electrons which emerge from the second beam generator 307 are accelerated to the anode potential, for example in the range of 1 kV to 30 kV, as a result of a potential difference between the second beam generator 307 and the third electrode 310. The second particle beam 312 in the form of the electron beam passes through the beam guide tube 311, and is focused onto the object 304.

The beam guide tube 311 passes through a collimator arrangement 313 which has a first annular coil 314 and a yoke 315. Seen in the direction of the object 304, from to the second beam generator 307, the collimator arrangement 313 is followed by a pin hole diaphragm 316 and a detector 317 with a central opening 318 arranged along the second optical axis 306 in the beam guide tube 311.

The beam guide tube 311 then runs through a hole in a second objective lens 319. The second objective lens 319 is used for focusing the second particle beam 312 onto the object 304. For this purpose, the second objective lens 319 has a magnetic lens 320 and an electrostatic lens 321. The magnetic lens 320 is provided with a second annular coil 322, an inner pole piece 323 and an outer pole piece 324. The electrostatic lens 321 comprises an end 325 of the beam guide tube 311 and a terminating electrode 326.

The end 325 of the beam guide tube 311 and the terminating electrode 326 concurrently form an electrostatic deceleration device. The end 325 of the beam guide tube 311, together with the beam guide tube 311, is at the anode potential, while the terminating electrode 326 and the object 304 are at a potential which is lower than the anode potential. This allows the electrons of the second particle beam 312 to be decelerated to a desired energy which is required for examination of the object 304.

The second particle beam column 302 furthermore has a raster device 327, by which the second particle beam 312 can be deflected and can be scanned in the form of a raster over the object 304.

For imaging purposes, the detector 317 which is arranged in the beam guide tube 311 detects secondary electrons and/or backscattered electrons, which result from the interaction between the second particle beam 312 and the object 304. The signals generated by the detector 317 are transmitted to a control unit 123.

Interaction radiation, for example X-rays or cathodoluminescence light, may be detected by using a radiation detector 500, for example a CCD-detector, which is arranged in the object chamber 303 (see FIG. 4). The radiation detector 500 is positioned at the side of the object 304 and is directed to the object 304.

The object 304 is arranged on an object holder 328 in the form of a sample stage as shown in FIG. 4, by which the object 304 is arranged such that it can move along three axes which are arranged to be mutually perpendicular (specifically an x-axis, a y-axis and a z-axis). Furthermore, the sample stage can be rotated about two rotation axes which are arranged to be mutually perpendicular. It is therefore possible to move the object 304 to a desired position. The rotation of the object holder 328 about one of the two rotation axes may be used to tilt the object holder 328 such that the surface of the object 304 may be oriented perpendicular to the second particle beam 312 or to the first particle beam 329, which will be described further below. Alternatively, the surface of the object 304 may be oriented in such a way that the surface of the object 304, on one hand, and the first particle beam 329 or the second particle beam 312, on the other hand, are at an angle, for example in the range of 0° to 90°.

As mentioned previously, reference sign 301 denotes the first particle beam column, in the form of the ion beam column. The first particle beam column 301 has a particle beam generator 1000A for generating ions. The particle beam generator 1000A comprises a first beam generator 331A in the form of an ion source. The first beam generator 331A is used for generating the first particle beam 329 in the form of an ion beam. The first beam generator 331A may be a liquid metal ion source (LMIS), for example a gallium liquid metal ion source. It is noted that the invention is not restricted to a liquid metal ion source. Rather, any ion source suitable for the system described herein may be used. Furthermore, the particle beam generator 1000A comprises a suppressor electrode 331B and an extractor electrode 331C. The particle beam generator 1000A comprises an ion beam generator control unit 336. The first beam generator 331A, the suppressor electrode 331B and the extractor electrode 331C are connected to the ion beam generator control unit 336 and are supplied with voltage by the ion beam generator control unit 336. This will be explained in detail further below.

The first particle beam column 301 is also provided with a collimator 332. The collimator 332 is followed by a variable aperture 333 in the direction of the object 304 along the first optical axis 305. The first particle beam 329 is focused onto the object 304 by a first objective lens 334 in the form of focusing lenses. Raster electrodes 335 are provided, in order to scan the first particle beam 329 over the object 304 in the form of a raster.

When the first particle beam 329 strikes the object 304, the first particle beam 329 interacts with the material of the object 304. In the process, interaction radiation is generated and detected using the radiation detector 500. Interaction particles are generated, in particular secondary electrons and/or secondary ions. These are detected using the detector 317.

The object chamber 303 is operated in a first pressure range or in a second pressure range, wherein the first pressure range only comprises pressures lower than or equal to $10^{-3}$ hPa and wherein the second pressure range only comprises pressures over $10^{-3}$ hPa. A pressure sensor (not shown in FIG. 4) is arranged in the object chamber 303 for measuring the pressure in the object chamber 303. A vacuum system (not shown in FIG. 4) in form of a pump system being connected to the pressure sensor and arranged at the object chamber 303 provides for the pressure range in the object chamber 303, either the first pressure range or the second pressure range.

The first particle beam 329 may also be used to process the object 304. For example, material may be deposited on the surface of the object 304 using the first particle beam 329, wherein the material is provided with a gas injection system (GIS). Additionally or alternatively, structures may be etched into the object 304 using the first particle beam 329. Moreover, the second particle beam 312 may be used to process the object 304, for example by electron-beam-induced deposition.

The detector 317 and the radiation detector 500 are connected to the control unit 123 as shown in FIGS. 4 and 5. The control unit 123 comprises a processor 124 into which a computer program product comprising a program code is loaded, which, when being executed, controls the particle beam device 300 in such a way that a method according to the system described herein is carried out. This will be explained further below.

Figure 6:
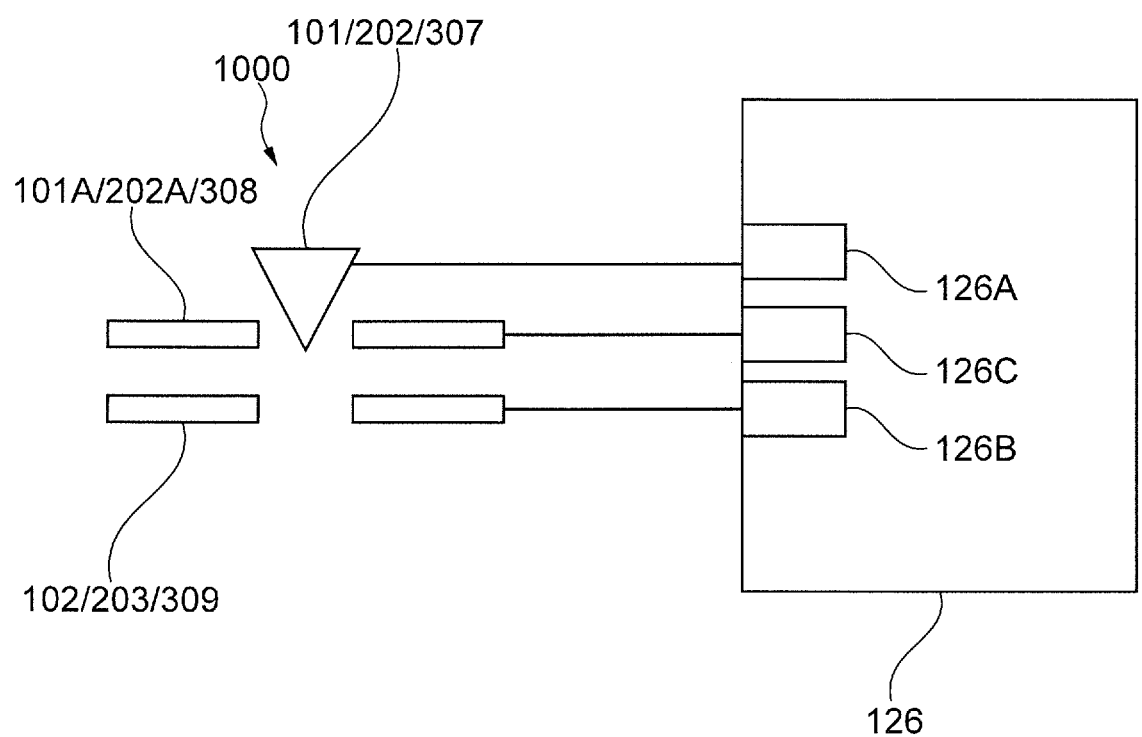
FIG. 6 shows a schematic representation of a first embodiment of a particle beam generator according to the system described herein.
Figure 7:
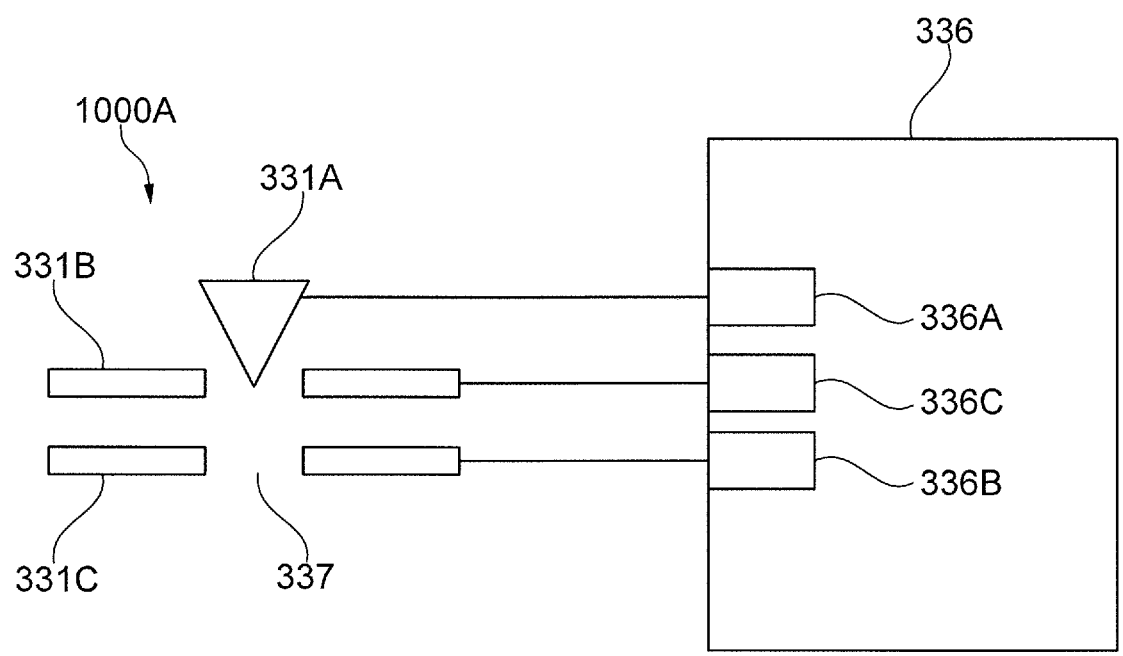
FIG. 7 shows a schematic representation of a second embodiment of a particle beam generator according to the system described herein.

FIG. 6 shows the particle beam generator 1000 of the SEM 100 of FIG. 2 according to an embodiment of the system described herein. Other embodiments of a particle beam generator, including variations of the particle beam generators of FIG. 6-7, are possible and intended to fall within the scope of the invention As mentioned above, the particle beam generator 1000 comprises the electron source 101 being a cathode, the suppressor electrode 101A and the extractor electrode 102. As mentioned above, the particle beam generator 1000 also comprises the beam generator control unit 126. The electron source 101, the suppressor electrode 101A and the extractor electrode 102 are connected to the beam generator control unit 126. In particular, the electron source 101 is connected to a variable voltage supply unit, in particular a source high voltage supply unit 126A of the beam generator control unit 126. The source high voltage supply unit 126A supplies the electron source 101 with high voltage. Moreover, the extractor electrode 102 is connected to a first variable voltage supply unit, in particular a first variable high voltage supply unit 126B of the beam generator control unit 126. The first variable high voltage supply unit 126B supplies a voltage in the form of an extractor voltage to the extractor electrode 102. The extractor voltage may be in the range of 6 kV to 8 kV, wherein the boundaries are included in the range. Furthermore, the suppressor electrode 101A is connected to a second variable voltage supply unit, in particular a second variable high voltage supply unit 126C of the beam generator control unit 126. The second variable high voltage supply unit 126C supplies a voltage in the form of a suppressor voltage to the suppressor electrode 101A. The suppressor voltage may be in the range of 0 V to (−2) kV, wherein the boundaries are included in the range.

FIG. 6 also shows the particle beam generator 1000 of the particle beam device 200 of FIG. 3 according to an embodiment of the system described herein. As mentioned above, the particle beam generator 1000 comprises the electron source 202 being a cathode, the suppressor electrode 202A and the extractor electrode 203. As mentioned above, the particle beam generator 1000 also comprises the beam generator control unit 126. The electron source 202, the suppressor electrode 202A and the extractor electrode 203 are connected to the beam generator control unit 126. In particular, the electron source 202 is connected to a variable voltage supply unit, in particular a source high voltage supply unit 126A of the beam generator control unit 126. The source high voltage supply unit 126A supplies the electron source 202 with high voltage. Moreover, the extractor electrode 203 is connected to a first variable voltage supply unit, in particular a first variable high voltage supply unit 126B of the beam generator control unit 126. The first variable high voltage supply unit 126B supplies a voltage in the form of an extractor voltage to the extractor electrode 203. The extractor voltage may be in the range of 6 kV to 8 kV, wherein the boundaries are included in the range. Furthermore, the suppressor electrode 202A is connected to a second variable voltage supply unit, in particular a second variable high voltage supply unit 126C of the beam generator control unit 126. The second variable high voltage supply unit 126C supplies a voltage in the form of a suppressor voltage to the suppressor electrode 202A. The suppressor voltage may be in the range of 0 V to (−2) kV, wherein the boundaries are included in the range.

Furthermore, FIG. 6 shows the particle beam generator 1000 of the second particle beam column 302 in the form of the electron beam column of FIGS. 4 and 5. As mentioned above, the particle beam generator 1000 comprises the second beam generator 307, the first electrode 308 in the form of a suppressor electrode and the second electrode 309 in the form of an extractor electrode. As mentioned above, the particle beam generator 1000 also comprises the beam generator control unit 126. The second beam generator 307, the first electrode 308 and the second electrode 309 are connected to the beam generator control unit 126. In particular, the second beam generator 307 is connected to a variable voltage supply unit, in particular a source high voltage supply unit 126A of the beam generator control unit 126. The source high voltage supply unit 126A supplies the second beam generator 307 with high voltage. Moreover, the second electrode 309 is connected to a first variable voltage supply unit, in particular a first variable high voltage supply unit 126B of the beam generator control unit 126. The first variable high voltage supply unit 126B supplies a voltage in the form of an extractor voltage to the second electrode 309. The extractor voltage may be in the range of 6 kV to 8 kV, wherein the boundaries are included in the range. Furthermore, the first electrode 308 is connected to a second variable voltage supply unit, in particular a second variable high voltage supply unit 126C of the beam generator control unit 126. The second variable high voltage supply unit 126C supplies a voltage in the form of a suppressor voltage to the first electrode 308. The suppressor voltage may be in the range of 0 V to (−2) kV, wherein the boundaries are included in the range.

As mentioned above, the particle beam generator 1000 may be a thermal field emitter. This will be explained with respect to the particle beam generator 1000 of the SEM 100 of FIG. 2. The electron source 101 is heated while being objected to a strong field which causes electrons to be emitted using the Schottky effect such that an electron beam is generated. The suppressor electrode 101A suppresses emissions of the electrons from the side surface of the electron source 101. Moreover, the extractor electrode 102 extracts the electrons from the electron source 101.

FIG. 7 shows the particle beam generator 1000A of the first particle beam column 301 in the form of the ion beam column of FIGS. 4 and 5, according to an embodiment of the system described herein. As mentioned above, the particle beam generator 1000A comprises the first beam generator 331A, the suppressor electrode 331B and the extractor electrode 331C. As mentioned above, the particle beam generator 1000A also comprises the ion beam generator control unit 336. The first beam generator 331A, the suppressor electrode 331B and the extractor electrode 331C are connected to the ion beam generator control unit 336. In particular, the first beam generator 331A is connected to a variable voltage supply unit, in particular an ion high voltage supply unit 336A of the ion beam generator control unit 336. The ion high voltage supply unit 336A supplies the first beam generator 331A with high voltage. Moreover, the extractor electrode 331C is connected to a first variable voltage supply unit, in particular a first variable high voltage supply unit 336B of the ion beam generator control unit 336. The first variable high voltage supply unit 336B supplies a voltage in the form of an extractor voltage to the extractor electrode 331C. The extractor voltage may be in the range of (−6) kV to (−8) kV, wherein the boundaries are included in the range. Furthermore, the suppressor electrode 331B is connected to a second variable voltage supply unit, in particular a second variable high voltage supply unit 336C of the ion beam generator control unit 336. The second variable high voltage supply unit 336C supplies a voltage in the form of a suppressor voltage to the suppressor electrode 331B. The suppressor voltage may be in the range of 0 V to 2 kV, wherein the boundaries are included in the range.

When operating the particle beam generator 1000A, the extractor electrode 331C is biased with a negative high voltage with respect to the first beam generator 331A. The first beam generator 331A may be an emitter tip, for example a liquid metal emitter tip. Atoms of the emitter tip are ionized due to a strong electric field in the immediate vicinity of the emitter tip. Moreover, the atoms are accelerated into the direction of the extractor electrode 331C. These ions form the ion beam. The emission current of the particle beam generator 1000A and, therefore, the ion beam current may be varied by supplying different voltages to the suppressor electrode 331B.

Figure 8:
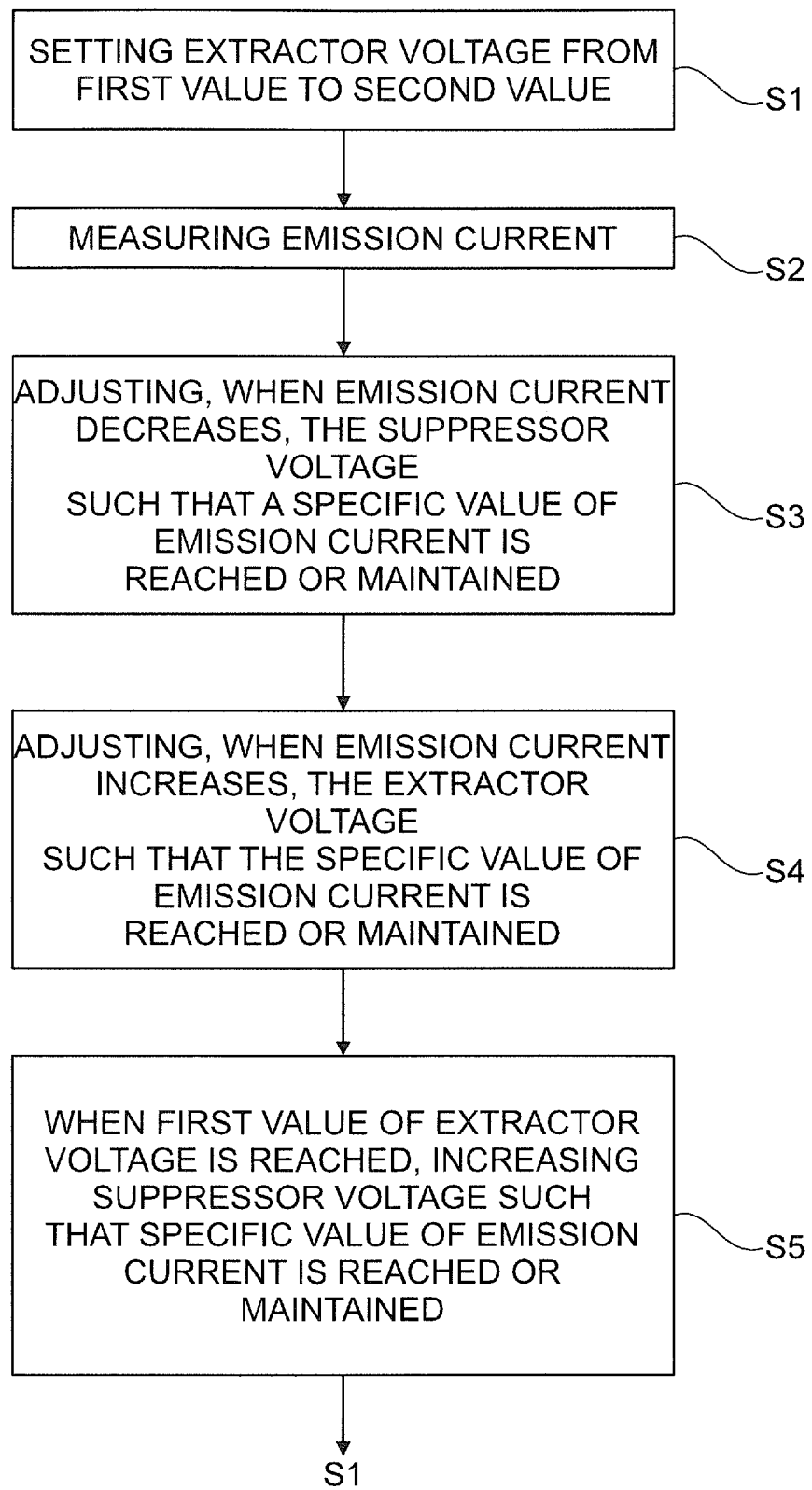
FIG. 8 shows a flow chart of method steps of a method for operation of a particle beam generator according to the system described herein.
Figure 9:
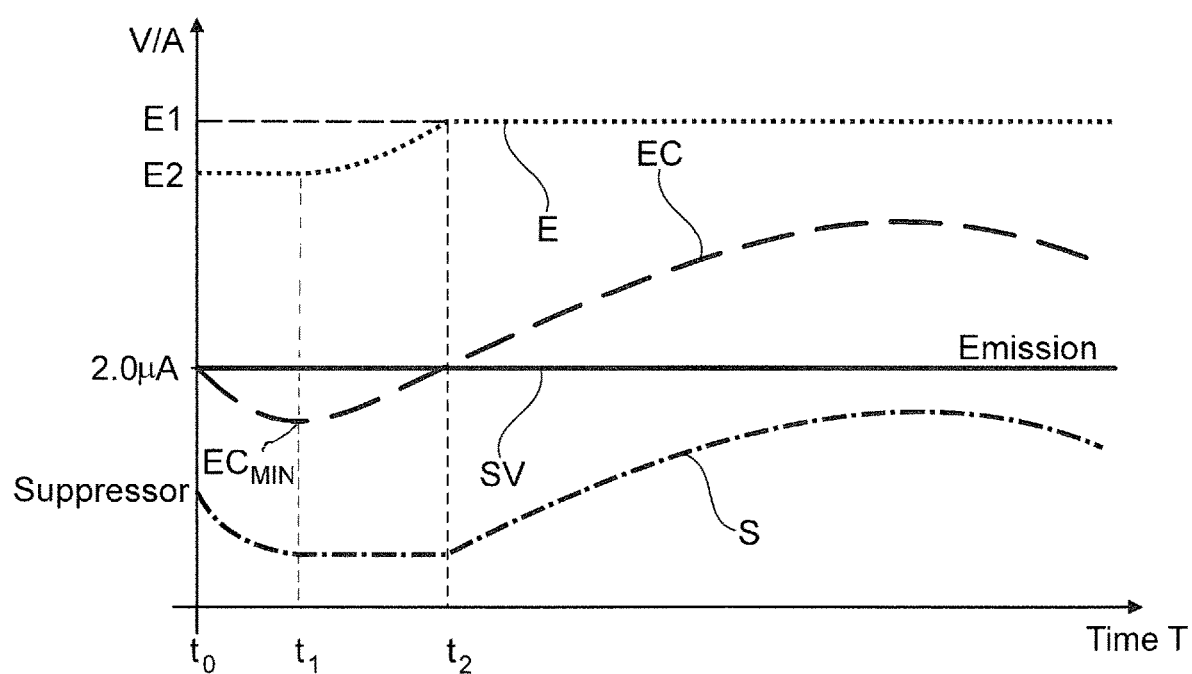
FIG. 9 shows a schematic representation of an emission current of a particle beam generator according to an embodiment of the system described herein dependent on time.

An embodiment of the method according to the system described herein will now be discussed with respect to the particle beam generator 1000A of the first particle beam column 301 in the form of the ion beam column of the particle beam device 300 of FIGS. 4 and 5. Such embodiment is shown in FIGS. 8 and 9. Other embodiments of such a method, including variations of the method shown in FIGS. 8 and 9, are possible and intended to fall within the scope of the invention. In some embodiments, the suppressor voltage and the extractor voltage adjusted in the method according to the system described herein are absolute voltages. It is noted that the method according to the system described herein may be carried out also for the particle beam generator 1000 of the SEM 100 of FIG. 2, of the particle beam device 200 of FIG. 3 and of the second particle beam column 302 in the form of an electron beam column of the particle beam device 300 of FIGS. 4 and 5.

When using the particle beam generator 1000A, one is intent on obtaining a more or less constant and specific emission current of the particle beam generator 1000A which is an ion beam generator. The aforementioned is also the intention for other particle beams, such as an electron beam, for example an electron beam for EDX microanalysis. As mentioned above, the emission current is the current comprising the ions provided by the particle beam generator 1000A and, by adjusting the suppressor voltage and the extractor voltage, a desired and specific emission current is provided. A typical specific emission current of the particle beam generator 1000A is in the range of 1.8 µA to 2.2 µA. For example, the specific emission current of the particle beam generator 1000A is 2 µA. It is known to adjust the suppressor voltage applied to the suppressor electrode 331B such that the specific emission current of the particle beam generator 1000A is reached or maintained. However, as mentioned above, if the emission current decreases and falls below a specific threshold, the suppressor voltage applied to the suppressor electrode 331B does not influence the emission current anymore. Thus, one may choose a different extractor voltage applied to the extractor electrode 331C to obtain the specific emission current of the particle beam generator 1000A.

When a different extractor voltage applied to the extractor electrode 331C is chosen, the method according to the system described herein comprises in method step S1 setting the extractor voltage applied to the extractor electrode 331C from a first value E1 to a second value E2 using the first variable high voltage supply unit 336B. The first value E1 of the extractor voltage and the second value E2 of the extractor voltage are different. In particular, the first value E1 of the extractor voltage is higher than the second value E2 of the extractor voltage. Method step S1 is carried out at an initial time to shown in FIG. 9.

The method according to the system described herein also comprises measuring the emission current EC of the particle beam generator 1000A in method step S2. The emission current EC is measured between the first beam generator 331A and the extractor electrode 331C. About 90% of the ions emitted by the first beam generator 331A impinge on the extractor electrode 331C. Only a minor portion of the ions emitted by the first beam generator 331A passes a hole 337 of the extractor electrode 331C and is provided into the further first particle beam column 301. Therefore, by measuring the ions impinging on the extractor electrode 331C, the emission current EC is sufficiently determined.

The actual emission current EC is known due to method step S2. Further method steps of the method according to the system described herein may now be carried out when the emission current EC changes. When the emission current EC of the particle beam generator 1000A decreases, the suppressor voltage S applied to the suppressor electrode 331B is adjusted using the second variable high voltage supply unit 336C such that the desired and specific emission current SV of the particle beam generator 1000A is reached or maintained, namely 2 µA (method step S3). As shown in FIG. 9, the suppressor voltage S of the suppressor electrode 331B is adjusted by decreasing the suppressor voltage S.

The suppressor voltage S is decreased until the emission current EC of the particle beam generator 1000A has reached a minimum $EC_{MIN}$ at a first time $t_1$. For times after the first time $t_1$, the emission current EC increases. When the emission current EC of the particle beam generator 1000A increases, the extractor voltage E applied to the extractor electrode 331C is adjusted using the first variable high voltage supply unit 336B (method step S4). The extractor voltage E of the extractor electrode 331C is adjusted in such a way that the specific emission current SV of the particle beam generator 1000A is reached or maintained. As shown in FIG. 9, the extractor voltage E is increased from the second value E2 back to the first value E1 of the extractor voltage E applied to the extractor electrode 331C.

When the first value E1 of the extractor voltage E applied to the extractor electrode 331C is reached at a second time $t_2$, adjustment of the extractor voltage E is stopped. Therefore, for times after the second time $t_2$, the extractor voltage E is at the first value E1.

When the first value E1 of the extractor voltage E is reached by increasing the extractor voltage E from the second value E2 to the first value E1, the suppressor voltage S applied to the suppressor electrode 331B is increased using the second variable high voltage supply unit 336C such that the specific emission current SV of the particle beam generator 1000A is reached or maintained (method step S5).

The method according to the system described herein may be repeated by starting method step S1 again after method step S5 has been completed.

The method according to the system described herein provides for a simple means for adjusting and/or controlling the emission current EC of the particle beam generator 1000A. In particular, the method according to the system described herein may ensure that the specific emission current SV used for the first particle beam column 301 is provided. Although the extractor voltage E is temporarily changed, the current of the ion beam impinging on the object 304 does not have to be readjusted since the ion beam impinging on the object 304 does not have to be realigned. Therefore, the path of the ion beam within the first particle beam column 301 is not changed. The alignment of the ion beam impinging on the object 304 before the extractor voltage E has been changed and, therefore, the current of the ion beam impinging on the object 304, can still be used after the extractor voltage E has been changed.

Various embodiments discussed herein may be combined with each other in appropriate combinations in connection with the system described herein. Additionally, in some instances, the order of steps in the flow diagrams, flowcharts and/or described flow processing may be modified where appropriate. Further, various aspects of the system described herein may be implemented using software, hardware, a combination of software and hardware and/or other computer-implemented modules or devices having the described features and performing the described functions. The system may further include a display and/or other computer components for providing a suitable interface with a user and/or with other computers.

Software implementations of aspects of the system described herein may include executable code that is stored in a computer-readable medium and executed by one or more processors. The computer-readable medium may include volatile memory and/or non-volatile memory, and may include, for example, a computer hard drive, ROM, RAM, flash memory, portable computer storage media such as a CD-ROM, a DVD-ROM, an SO card, a flash drive or other drive with, for example, a universal serial bus (USB) interface, and/or any other appropriate tangible or non-transitory computer-readable medium or computer memory on which executable code may be stored and executed by a processor. The system described herein may be used in connection with any appropriate operating system.

Other embodiments of the system described herein will be apparent to those skilled in the art from a consideration of the specification and/or an attempt to put into practice the system described herein disclosed herein. It is intended that the specification and examples be considered as exemplary only, with the true scope and spirit of the invention being indicated by the following claims.

The invention claimed is:

1. A method of operating a particle beam generator for a particle beam device, wherein the particle beam generator includes at least one particle source configured to emit charged particles, at least one suppressor electrode configured to suppress emissions of the charged particles from a side surface of the particle source, at least one extractor electrode configured to extract the charged particles from the particle source, at least one first variable voltage supply unit for applying an extractor voltage to the extractor electrode, and at least one second variable voltage supply unit for applying a suppressor voltage to the suppressor electrode, the method comprising:

setting the extractor voltage to an extractor value using the first variable voltage supply unit;

measuring an emission current of the particle beam generator;

adjusting, when the emission current of the particle beam generator decreases, the suppressor voltage applied to the suppressor electrode using the second variable voltage supply unit such that a specific emission current of the particle beam generator is reached or maintained; and adjusting, when the emission current of the particle beam generator increases, the extractor voltage applied to the extractor electrode using the first variable voltage supply unit such that the specific emission current of the particle beam generator is reached or maintained.

2. The method according to claim 1, wherein adjusting the suppressor voltage applied to the suppressor electrode includes decreasing the suppressor voltage applied to the suppressor electrode.

3. The method according to claim 1, wherein adjusting the extractor voltage applied to the extractor electrode includes increasing the extractor voltage applied to the extractor electrode.

4. The method according to claim 1, wherein setting the extractor voltage to the extractor value includes setting the extractor voltage from a first value of the extractor voltage to a second value of the extractor voltage, wherein the first value of the extractor voltage is higher than the second value of the extractor voltage.

5. The method according to claim 4, wherein adjusting the extractor voltage applied to the extractor electrode includes increasing the extractor voltage applied to the extractor electrode from the second value of the extractor voltage to the first value of the extractor voltage until the first value of the extractor voltage is reached.

6. The method according to claim 5, further comprising:
increasing, when the first value of the extractor voltage is reached, the suppressor voltage applied the suppressor electrode using the second variable voltage supply unit such that the specific emission current of the particle beam generator is reached or maintained.

7. The method according to claim 1, wherein adjusting the suppressor voltage applied to the suppressor electrode comprises increasing the suppressor voltage applied to the suppressor electrode.

8. The method according to claim 1, wherein adjusting the extractor voltage applied to the extractor electrode includes decreasing the extractor voltage applied to the extractor electrode.

9. The method according to claim 7, wherein setting the extractor voltage to the extractor value includes setting the extractor voltage from a first value of the extractor voltage to a second value of the extractor voltage, wherein the first value of the extractor voltage is lower than the second value of the extractor voltage.

10. The method according to claim 9, wherein adjusting the extractor voltage applied to the extractor electrode includes decreasing the extractor voltage applied to the extractor electrode from the second value of the extractor voltage to the first value of the extractor voltage until the first value of the extractor voltage is reached.

11. The method according to claim 10, further comprising:
decreasing, when the first value of the extractor voltage is reached, the suppressor voltage applied the suppressor electrode using the second variable voltage supply unit such that the specific emission current of the particle beam generator is reached or maintained.

12. The method according to claim 1, wherein the method further comprises one of the following steps:
(i) using an ion beam generator as the particle beam generator; and
(ii) using an electron beam generator as the particle beam generator.

13. A computer program product comprising a program code which is loaded into a processor and which, when being executed, controls a particle beam device including a particle beam generator having at least one particle source configured to emit charged particles, at least one suppressor electrode configured to suppress emissions of the charged particles from a side surface of the particle source, at least one extractor electrode configured to extract the charged particles from the particle source, at least one first variable voltage supply unit for applying an extractor voltage to the extractor electrode, and at least one second variable voltage supply unit for applying a suppressor voltage to the suppressor electrode, the executed program code setting the extractor voltage to an extractor value using the first variable voltage supply unit, measuring an emission current of the particle beam generator, adjusting, when the emission current of the particle beam generator decreases, the suppressor voltage applied to the suppressor electrode using the second variable voltage supply unit such that a specific emission current of the particle beam generator is reached or maintained, and adjusting, when the emission current of the particle beam generator increases, the extractor voltage applied to the extractor electrode using the first variable voltage supply unit such that the specific emission current of the particle beam generator is reached or maintained.

14. A particle beam device for imaging, analyzing and/or processing an object, comprising:

at least one particle beam generator for generating a particle beam having charged particles, wherein the particle beam generator includes at least one particle source configured to emit charged particles, at least one suppressor electrode configured to suppress emissions of the charged particles from a side surface of the particle source, at least one extractor electrode configured to extract the charged particles from the particle source, at least one first variable voltage supply unit for applying an extractor voltage to the extractor electrode, and at least one second variable voltage supply unit for applying a suppressor voltage to the suppressor electrode; and a processor into which a computer program product is loaded that sets the extractor voltage to an extractor value using the first variable voltage supply unit, measures an emission current of the particle beam generator, adjusts, when the emission current of the particle beam generator decreases, the suppressor voltage applied to the suppressor electrode using the second variable voltage supply unit such that a specific emission current of the particle beam generator is reached or maintained, and adjusts, when the emission current of the particle beam generator increases, the extractor voltage applied to the extractor electrode using the first variable voltage supply unit such that the specific emission current of the particle beam generator is reached or maintained.

15. The particle beam device according to claim 14, further comprising:
- at least one objective lens for focusing the particle beam onto the object; and
- at least one detector for detecting interaction particles and/or interaction radiation, the interaction particles and the interaction radiation being generated when the particle beam impinges on the object.

16. The particle beam device according to claim 15, wherein the particle beam generator is a first particle beam generator for generating a first particle beam having first charged particles, wherein the objective lens is a first objective lens for focusing the first particle beam onto the object, and wherein the particle beam device further comprises:
- a second particle beam generator for generating a second particle beam having second charged particles and a second objective lens for focusing the second particle beam onto the object.

17. The particle beam device according to claim 14, wherein the particle beam device is at least one of the following: an electron beam device and an ion beam device.

* * * * *